(12) United States Patent
Park et al.

(10) Patent No.: US 12,077,693 B2
(45) Date of Patent: *Sep. 3, 2024

(54) ADHESIVE COMPOSITION FOR FOLDABLE DISPLAY, AND FOLDABLE DISPLAY COMPRISING SAME

(71) Applicant: LG CHEM, LTD., Seoul (KR)

(72) Inventors: Hyon Gyu Park, Daejeon (KR); Hee Song, Daejeon (KR); Hyunsup Lee, Daejeon (KR); Yoonkyung Kwon, Daejeon (KR)

(73) Assignee: LG CHEM, LTD., Seoul (KR)

(*) Notice: Subject to any disclaimer, the term of this patent is extended or adjusted under 35 U.S.C. 154(b) by 351 days.

This patent is subject to a terminal disclaimer.

(21) Appl. No.: 16/755,620

(22) PCT Filed: Dec. 11, 2018

(86) PCT No.: PCT/KR2018/015701
§ 371 (c)(1),
(2) Date: Apr. 13, 2020

(87) PCT Pub. No.: WO2019/117594
PCT Pub. Date: Jun. 20, 2019

(65) Prior Publication Data
US 2020/0332153 A1    Oct. 22, 2020

(30) Foreign Application Priority Data
Dec. 11, 2017 (KR) .................. 10-2017-0169347

(51) Int. Cl.
*C09J 7/38* (2018.01)
*B29C 65/48* (2006.01)
(Continued)

(52) U.S. Cl.
CPC ............... *C09J 7/385* (2018.01); *B29C 65/48* (2013.01); *C09J 7/10* (2018.01); *H05K 1/18* (2013.01);
(Continued)

(58) Field of Classification Search
CPC ........ H05K 5/0017; H05K 2201/10128; G02F 1/133305; G02F 2202/28; C09J 133/00;
(Continued)

(56) References Cited

U.S. PATENT DOCUMENTS 10,036,840 B2 * 7/2018 Takeda .................. G02B 5/305
2005/0181148 A1   8/2005 Kim et al.
(Continued)

FOREIGN PATENT DOCUMENTS

CN    101910345 A    12/2010
JP    2013-169322 A   9/2013
(Continued)

OTHER PUBLICATIONS

Lee, et al., "Effect of Crosslinking Density on Adhesion Performance and Flexibility Properties of Acrylic Pressure Sensitive Adhesives for Flexible Display Applications", International Journal of Adhesion and Adhesives 74 (2017) pp. 137-143 (Year: 2017).*
(Continued)

*Primary Examiner* — Scott R. Walshon
(74) *Attorney, Agent, or Firm* — ROTHWELL, FIGG, ERNST & MANBECK, P.C.

(57) ABSTRACT

An adhesive composition for a foldable display comprising a polymer comprising an alkyl (meth)acrylate and a monomer having a crosslinkable functional group; and a crosslinking agent is provided.

11 Claims, 1 Drawing Sheet

(51) Int. Cl.
*C09J 7/10* (2018.01)
*H05K 1/18* (2006.01)
*H05K 5/00* (2006.01)

(52) U.S. Cl.
CPC . *H05K 5/0017* (2013.01); *H05K 2201/10128* (2013.01)

(58) Field of Classification Search
CPC .... C09J 133/04; C09J 133/06; C09J 133/066; C09J 133/08; C09J 133/10; C09J 133/16; Y10T 428/28; Y10T 428/2809; Y10T 428/2839; Y10T 428/2848; Y10T 428/2852; Y10T 428/2878; Y10T 428/14; Y10T 428/1424; Y10T 428/1429; Y10T 428/1452; Y10T 428/1457; Y10T 428/1462; Y10T 428/1471; Y10T 428/1476
See application file for complete search history.

(56) References Cited

U.S. PATENT DOCUMENTS

| | | | |
|---|---|---|---|
| 2009/0110849 A1* | 4/2009 | Nishina | C08G 18/6229 428/1.31 |
| 2009/0169852 A1 | 7/2009 | Choi et al. | |
| 2011/0032455 A1 | 2/2011 | Kim et al. | |
| 2013/0015909 A1* | 1/2013 | Kim | C09J 133/08 428/332 |
| 2015/0079387 A1* | 3/2015 | Yang | C09J 133/12 526/320 |
| 2015/0369981 A1* | 12/2015 | Takeda | G02B 5/3025 359/488.01 |
| 2016/0122599 A1 | 5/2016 | Kim et al. | |
| 2016/0177147 A1* | 6/2016 | Han | C09J 7/10 428/220 |
| 2017/0200915 A1 | 7/2017 | Lee et al. | |

FOREIGN PATENT DOCUMENTS

| | | |
|---|---|---|
| JP | 2016-108555 A | 6/2016 |
| KR | 10-2005-0076706 A | 7/2005 |
| KR | 10-2006-0067404 A | 6/2006 |
| KR | 10-2008-0004021 A | 1/2008 |
| KR | 10-2009-0077664 A | 7/2009 |
| KR | 10-1622071 B1 | 5/2016 |
| KR | 10-2016-0083583 A | 7/2016 |
| KR | 10-2016-0135023 A | 11/2016 |
| KR | 2017-0084402 A | 7/2017 |
| KR | 2017-0097850 A | 8/2017 |
| KR | 10-2017-0122094 A | 11/2017 |
| WO | 2016-196541 A1 | 12/2016 |

OTHER PUBLICATIONS

International Search Report and Written Opinion issued for International Application No. PCT/KR2018/015701 on Mar. 19, 2019, 13 pages.

* cited by examiner

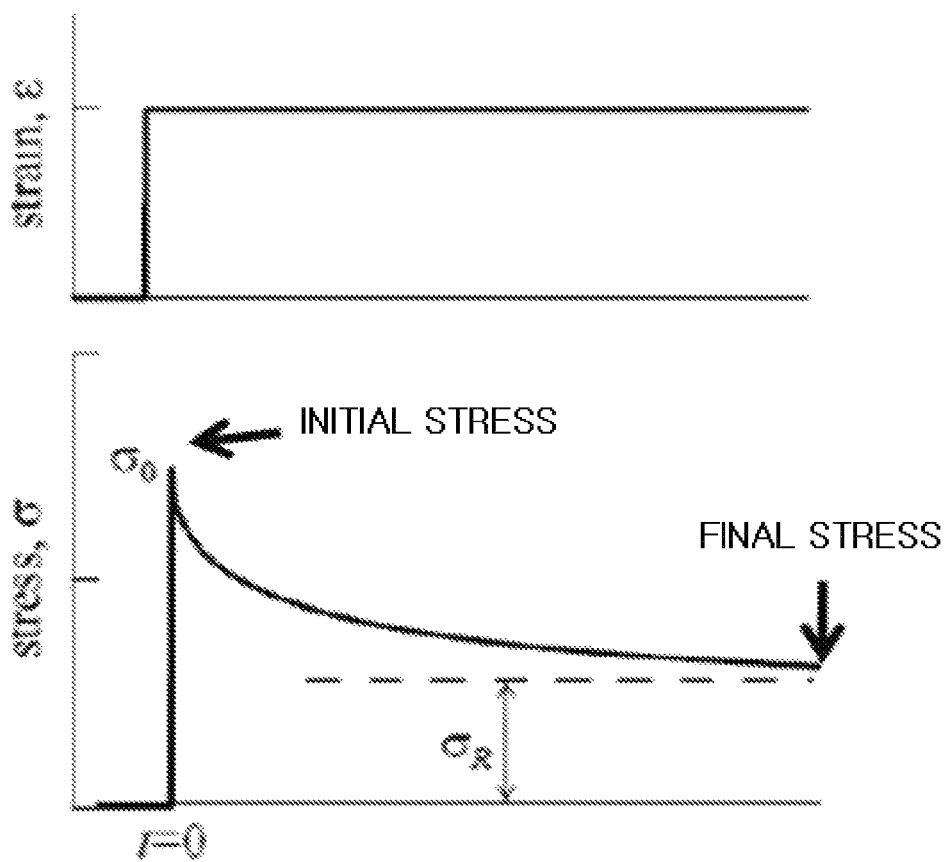

ADHESIVE COMPOSITION FOR FOLDABLE DISPLAY, AND FOLDABLE DISPLAY COMPRISING SAME

TECHNICAL FIELD

This application is a 35 U.S.C. 371 National Phase Entry Application from PCT/KR2018/015701, filed on Dec. 11, 2018, designating the United States and which claims priority to and the benefits of Korean Patent Application No. 10-2017-0169347, filed with the Korean Intellectual Property Office on Dec. 11, 2017, the entire contents of which are incorporated herein by reference.

The present application relates to an adhesive composition for a foldable display, and a foldable display comprising the same.

BACKGROUND OF THE INVENTION

With recent development of display-relating technologies, display devices transformable at the stage of use such as folding, rolling in a roll shape or stretching like a rubber band have been researched and developed. These displays may be transformed into various shapes, and therefore, may satisfy demands for both a larger display at the stage of use and a smaller display for portability.

A transformable display device may be transformed into various shapes in response to user demands or in accordance with needs of the situation in which the display device is used as well as transformed into shapes set in advance. Accordingly, the transformed shape of the display needs to be recognized, and the display device needs to be controlled in response to the recognized shape.

Meanwhile, a transformable display device has a problem in that each constitution of the display device may be damaged by transformation, and therefore, each constitution of such a display device needs to satisfy folding reliability and stability.

Moreover, an adhesive for a foldable display needs to satisfy the folding reliability and existing adhesive properties, and needs to satisfy driving condition under a global temperature change condition of −40° C. to 60° C.

In addition, in order to satisfy the folding reliability condition, a rheology behavior condition of the adhesive needs to be satisfied, and among rheological properties of the adhesive, the storage modulus value needs to be greater than or equal to $10^4$ Pa and less than or equal $10^6$ Pa, there should be no delamination after folding 100,000 times at room temperature and high temperature.

However, existing adhesive compositions for a foldable display have had problems in that, even when satisfying such a folding reliability condition, delamination and panel breakage occur when conducting a dynamic folding test at −20° C., a most severe condition among conditions allowing an actual folding test.

BRIEF SUMMARY OF THE INVENTION

The present specification is directed to providing an adhesive composition for a foldable display, and a foldable display comprising the same.

One embodiment of the present specification provides an adhesive composition for a foldable display comprising a polymer comprising an alkyl (meth)acrylate and a monomer having a crosslinkable functional group, and a crosslinking agent, wherein adhesive strength of the adhesive composition with a polyimide (PI) film after curing is greater than or equal to 500 gf/in and less than or equal to 5,000 gf/in at room temperature, storage modulus of the adhesive composition after curing measured under a condition of −20° C. and 1% strain is greater than or equal to 50,000 Pa and less than or equal to 250,000 Pa, initial stress at the time starting strain under a condition of −20° C. and 12% strain is greater than or equal to 5,000 Pa and less than or equal to 20,000 Pa, final stress measured after strain for 10 minutes under a condition of −20° C. and 12% strain is greater than or equal to 1,000 Pa and less than or equal to 10,000 Pa, and a stress drop defined by (initial stress-final stress)/(initial stress) is greater than or equal to 40% and less than or equal to 90%.

Another embodiment of the present specification provides an adhesive layer comprising the adhesive composition for a foldable display described above, or a cured material thereof.

Still another embodiment of the present specification provides a foldable display comprising a back plate substrate; the adhesive layer according to one embodiment of the present application provided on one surface of the back plate substrate; and a touch panel provided on a surface opposite to the surface in contact with the back plate substrate of the adhesive layer.

Advantageous Effects

An adhesive composition for a foldable display according to one embodiment of the present specification has advantages of satisfying reliability conditions without causing problems such as delamination and breakage even at −20° C. when conducting a folding test while maintaining properties of existing adhesive compositions for a foldable display such as reliability conditions and adhesion properties at room temperature and high temperature.

An adhesive layer prepared using the adhesive composition for a foldable display according to one embodiment of the present application can be used in a foldable display, and a foldable display comprising the adhesive layer according to the present application has properties of excellent durability since delamination and breakage of the adhesive do not occur during folding and recovering even at an extremely low temperature (−20° C.).

BRIEF DESCRIPTION OF DRAWINGS

FIG. 1 shows rates of strain and stress changes in a stress relaxation TEST according to one embodiment of the present specification.

DETAILED DESCRIPTION OF THE INVENTION

In the present specification, a description of one member being placed "on" another member comprises not only a case of the one member adjoining the another member but a case of still another member being present between the two members.

In the present specification, a description of a certain part "including" certain constituents means capable of further including other constituents, and does not exclude other constituents unless particularly stated on the contrary.

Hereinafter, the present specification will be described in more detail.

The present application relates to an adhesive composition for a foldable display, and a foldable display comprising the same.

One embodiment of the present specification provides an adhesive composition for a foldable display comprising a polymer comprising an alkyl (meth)acrylate and a monomer having a crosslinkable functional group, and a crosslinking agent, wherein adhesive strength of the adhesive composition with a polyimide film after curing is greater than or equal to 500 gf/in and less than or equal to 5,000 gf/in at room temperature, storage modulus of the adhesive composition after curing measured under a condition of −20° C. and 1% strain is greater than or equal to 50,000 Pa and less than or equal to 250,000 Pa, initial stress at the time starting strain under a condition of −20° C. and 12% strain is greater than or equal to 5,000 Pa and less than or equal to 20,000 Pa, final stress measured after strain for 10 minutes under a condition of −20° C. and 12% strain is greater than or equal to 1,000 Pa and less than or equal to 10,000 Pa, and a stress drop defined by (initial stress-final stress)/(initial stress) is greater than or equal to 40% and less than or equal to 90%.

Such an adhesive composition may be, for example, cured to form an adhesive layer, and the adhesive layer may be included in a foldable display to be used in applications such as attaching a display panel and cover glass.

In the present specification, the term "foldable display" may mean a flexible display designed to repeat folding and unfolding like a paper and having a folded part to have a radius of curvature of 5 mm or less.

An adhesive used in a foldable display needs to satisfy bending reliability unlike existing adhesives, and in order to have such excellent bending reliability, reliability needs to be satisfied in a wide temperature range.

The adhesive composition according to one embodiment of the present specification does not cause problems such as delamination and breakage when conducting a folding test at a low temperature (for example, −20° C.) as well as in room temperature and high temperature ranges, and therefore, has proper properties to be used in a foldable display.

According to one embodiment of the present specification, adhesive strength of the adhesive composition with the polyimide film after curing may be greater than or equal to 500 gf/in and less than or equal to 5,000 gf/in, more preferably greater than or equal to 800 gf/in and less than or equal to 2,000 gf/in, and even more preferably greater than or equal to 950 gf/in and less than or equal to 1,800 gf/in at room temperature.

By the adhesive strength of the adhesive composition with the polyimide film after curing satisfying the above-mentioned range at room temperature, delamination at an interface of the adhesive layer and a foldable display device does not occur when folding the foldable display comprising the adhesive layer comprising the same later on.

According to one embodiment of the present specification, the curing of the adhesive composition may comprise aging for 3 days at 40° C. after drying and curing for 3 minutes under a temperature condition of 120° C.

According to one embodiment of the present specification, the room temperature may mean 25° C.

According to one embodiment of the present specification, the polyimide film may use commercially available products, and may specifically be GF200 (SKC-Kolon PI), however, the polyimide film is not limited thereto.

According to one embodiment of the present specification, the adhesive strength is a value measuring 180° peel adhesive strength, and may be measured by laminating an adhesive on an adherend and leaving the result unattended for a day. As a measuring device, a texture analyzer (Stable Micro Systems) is used, and adhesive strength of the adhesive may be measured with a peel rate of 0.3 mpm and a specimen width of 1 inch.

In the present specification, the term "storage modulus" means commonly known "dynamic storage modulus". In other words, when applying sine-type shear strain to an elastic body, stress appears delayed in an intermediate form in a viscoelastic material, and when mathematically expressed, this means that one component is in the same phase, and the other component is delayed by pi/2, and herein, the part in the same phase, that is, energy stored without loss due to elasticity may be referred to as "dynamic storage modulus" or "storage modulus".

According to one embodiment of the present specification, the storage modulus value may be, for example, measured in accordance with a manual using an advanced rheometric expansion system (TA Instruments Inc.) under a 1% strain condition.

In one embodiment of the present specification, storage modulus of the adhesive composition after curing measured under a condition of −20° C. and 1% strain may be greater than or equal to 50,000 Pa and less than or equal to 250,000 Pa, preferably greater than or equal to 70,000 Pa and less than or equal to 250,000 Pa, and more preferably greater than or equal to 150,000 Pa and less than or equal to 250,000 Pa.

By satisfying the above-mentioned range, hardness of the adhesive layer comprising the adhesive composition is proper, and accordingly, properties of the adhesive layer are excellent, and stress that may be generated when folding may be released, and as a result, damages on the layer bonding with the adhesive layer are minimized. In addition, by the storage modulus having the above-mentioned range, properties of leaving no film folding marks are obtained by having excellent resilience when repeating folding and unfolding.

In other words, when storage modulus of the adhesive composition after curing measured under the condition of −20° C. and 1% strain is greater than the above-mentioned range, the adhesive becomes too hard damaging properties of the adhesive, which may damage the adhered layer by failing to release stress generated when folding. When the storage modulus is less than the above-mentioned range, a problem of visible film folding marks occurs after folding due to insufficient resilience.

The term "stress drop" in the present specification is defined by (initial stress-final stress)/(initial stress), and the stress drop may be adjusted by designing a molecular weight, a degree of crosslinking, and a composition of an adhesive.

A dynamic mechanical analyzer (DMA) (TA Instrument Inc.) is used as a device measuring the stress, and measurements are made using a sample having a size of approximately width: 6 mm, thickness: 1 mm and length: 10 mm to 15 mm under a condition of −20° C., 12% strain 600 seconds, and recovery 1200 seconds.

When the sample is stretched in a longer side direction through strain by 12% and maintained for a certain period of time, stress increased by tensile strain slowly decreases.

In other words, the greatest stress seen when stretched by 12% means initial stress, and the stress starts to decrease and is maintained without major changes after a certain period of time (600 seconds). The stress maintained as above means final stress.

FIG. 1 illustrates time-dependent changes in the strain and the stress. As seen in FIG. 1, the initial greatest stress when stretching the sample specimen with 12% strain is initial stress, and the stress after a certain period of time means final stress.

In addition, the measurement is made estimating that the strain generated when folding with 2.5 R is approximately 12%, and stress present in the adhesive immediately after folding and stress remaining when storing while being folded are simulated.

According to one embodiment of the present specification, the initial stress may be greater than or equal to 5,000 Pa and less than or equal to 20,000 Pa, and more preferably greater than or equal to 10,000 Pa and less than or equal to 18,000 Pa.

According to one embodiment of the present specification, final stress measured after strain for 10 minutes under a condition of −20° C. and 12% strain may be greater than or equal to 1,000 Pa and less than or equal to 10,000 Pa, and more preferably greater than or equal to 5,000 Pa and less than or equal to 8,000 Pa.

According to one embodiment of the present specification, the stress drop defined by (initial stress-final stress)/(initial stress) may be greater than or equal to 40% and less than or equal to 90%, and more preferably greater than or equal to 45% and less than or equal to 65%.

When the stress drop satisfies the range of 40% to 90%, the stress generated when folding is released and minimized, and cohesive strength maintaining adhesive strength is obtained, and therefore, excellent folding properties are obtained at all of low temperature, room temperature and high temperature.

On the other hand, when the stress drop is less than 40%, stress generated when folding is not released, which may cause cracks on a display panel or hard coating on a cover window side when repeatedly folding, or cause interfacial delamination due to large stress.

In addition, when the stress drop is greater than 90%, cohesive strength is too low, and therefore, adhesive strength becomes very low, or bubbles or delamination may occur at the interface when folding due to adhesive cohesion failure.

In the adhesive composition for a foldable display provided in one embodiment of the present application, the content of the alkyl (meth)acrylate is from 50 parts by weight to 99 parts by weight, and the content of the monomer having a crosslinkable functional group is from 1 parts by weight to 50 parts by weight based on 100 parts by weight of the polymer.

In one embodiment of the present specification, the content of the alkyl (meth)acrylate may be from 50 parts by weight to 99 parts by weight, preferably from 60 parts by weight to 99 parts by weight, and more preferably from 80 parts by weight to 99 parts by weight based on 100 parts by weight of the polymer.

In one embodiment of the present specification, the content of the monomer having a crosslinkable functional group may be from 1 parts by weight to 50 parts by weight, preferably from 1 parts by weight to 25 parts by weight, and more preferably from 1 parts by weight to 5 parts by weight based on 100 parts by weight of the polymer.

In the adhesive composition for a foldable display provided in one embodiment of the present application, the content of the crosslinking agent is in a range of 0.001 parts by weight to 5 parts by weight based on 100 parts by weight of the polymer.

In another embodiment, the content of the crosslinking agent may be from 0.001 parts by weight to 5 parts by weight, preferably from 0.01 parts by weight to 1 parts by weight, and more preferably from 0.01 parts by weight to 0.4 parts by weight based on 100 parts by weight of the polymer.

By the crosslinking agent content satisfying the above-mentioned range, target storage modulus may be obtained at a temperature of −20° C.

In the adhesive composition for a foldable display according to one embodiment of the present application, the ranges of storage modulus and stress drop may be satisfied by comprising a specific material in a specific content as above, and a foldable display comprising the adhesive layer accordingly has properties of excellent durability since no adhesive delamination and breakage occur when folding and recovering even at an extremely low temperature (−20° C.).

In the present specification, the term "parts by weight" means, unless defined otherwise, a weight ratio between each component.

The adhesive composition according to one embodiment of the present specification may be a polymer of an alkyl (meth)acrylate and a monomer having a crosslinkable functional group.

According to one embodiment of the present specification, the alkyl (meth)acrylate may be an alkyl (meth)acrylate having an alkyl group with 1 to 20 carbon atoms, and examples thereof may comprise methyl (meth)acrylate, ethyl (meth)acrylate, n-propyl (meth)acrylate, isopropyl (meth)acrylate, n-butyl (meth)acrylate, t-butyl (meth)acrylate, isobutyl (meth)acrylate, 2-ethylhexyl (meth)acrylate, 2-ethylbutyl (meth)acrylate, pentyl (meth)acrylate, hexyl (meth)acrylate, cyclohexyl (meth)acrylate, n-octyl (meth)acrylate, isooctyl (meth)acrylate, isononyl (meth)acrylate, decyl (meth)acrylate, dodecyl (meth)acrylate, tridecyl (meth)acrylate, tetradecyl (meth)acrylate, octadecyl (meth)acrylate or isobornyl (meth)acrylate and the like, but are not limited thereto.

Herein, the term "(meth)acrylate" means acrylate or methacrylate.

According to one embodiment of the present specification, the monomer having a crosslinkable functional group may be selected without particular limit as long as it is capable of providing a crosslinkable functional group to the polymer produced from polymerization with the alkyl (meth)acrylate monomer.

According to one embodiment of the present specification, the crosslinkable functional group may be any one or more selected from the group consisting of a hydroxyl group, an isocyanate group, a glycidyl group, an epoxy group, an amine group and a carboxyl group.

Examples of the monomer having a hydroxyl group may comprise a hydroxyalkyl (meth)acrylate such as 2-hydroxyethyl (meth)acrylate, 2-hydroxypropyl (meth)acrylate, 4-hydroxybutyl (meth)acrylate, 6-hydroxyhexyl (meth)acrylate or 8-hydroxyoctyl (meth)acrylate; a hydroxypolyalkylene glycol (meth)acrylate such as hydroxypolyethylene glycol (meth)acrylate or hydroxypolypropylene glycol (meth)acrylate; and the like, but are not limited thereto.

Examples of the monomer having a carboxyl group may comprise beta-carboxyethyl acrylate, (meth)acrylic acid, 2-(meth)acryloyloxy acetic acid, 3-(meth)acryloyloxy propionic acid, 4-(meth)acryloyloxy butyric acid, an acrylic acid dimer, itaconic acid, maleic acid, maleic anhydride or the like, but are not limited thereto.

Examples of the monomer having an amine group may comprise 2-aminoethyl (meth)acrylate, 3-aminopropyl (meth)acrylate, N,N-dimethylaminoethyl (meth)acrylate, N,N-dimethylaminopropyl (meth)acrylate or the like, but are not limited thereto.

Among the monomers having various crosslinkable functional groups, proper types may be selected considering a target glass transition temperature of the acrylic polymer or reactivity with a crosslinking agent to describe later.

According to one embodiment of the present specification, the crosslinkable functional group may be a carboxyl group.

According to one embodiment of the present specification, the crosslinkable functional group may be selected without limit as long as it is capable of, for example, producing a crosslinking reaction with a crosslinking agent to describe later at a temperature in a range of approximately 50° C. to 300° C.

The adhesive composition according to one embodiment of the present specification may have a glass transition temperature (Tg) in a range of −150° C. to 0° C. In such a glass transition temperature (Tg) range, an adhesive composition having a low storage modulus change rate in a wide temperature range may be provided.

According to one embodiment of the present specification, the adhesive composition may have a glass transition temperature (Tg) in a range of −150° C. to 0° C., −100° C. to −10° C., or −90° C. to −20° C.

In the adhesive composition for a foldable display provided in one embodiment of the present specification, a glass transition temperature (Tg) of the adhesive composition for a foldable display is higher than or equal to −50° C. and lower than or equal to −20° C.

In another embodiment, a glass transition temperature (Tg) of the adhesive composition for a foldable display may be higher than or equal to −50° C. and lower than or equal to −20° C., preferably higher than or equal to −40° C. and lower than or equal to −25° C., and more preferably higher than or equal to −40° C. and lower than or equal to −30° C.

By the glass transition temperature of the adhesive composition for a foldable display satisfying the above-mentioned range, the adhesive layer comprising the same later on has excellent hardness and adhesion, and has properties of excellent folding properties at a low temperature driving of a foldable display.

As the glass transition temperature in the present specification, G' and tan δ values at a temperature range of −60° C. to 80° C. and a frequency of 1 Hz are measured using a rotational rheometer ARES-G2. When raising a temperature at a temperature-raising rate of 5° C./min, tan δ forms a peak in a part where G' rapidly decreases, and the temperature at which the highest point of the tan δ appears may be identified as a Tg value.

The glass transition temperature of the adhesive composition for a foldable display may means a glass transition temperature of the whole adhesive composition comprising all monomer components included in the adhesive composition.

According to another embodiment of the present specification, the polymer may have a weight average molecular weight in a range of 5,000 to 3,000,000.

In the present specification, the term weight average molecular weight may mean a conversion factor for standard polystyrene measured by gel permeation chromatography (GPC), and unless particularly defined otherwise, a molecular weight of a certain polymer may mean a weight average molecular weight of the polymer. In another embodiment, the polymer may have a weight average molecular weight in a range of 100,000 to 2,500,000, 500,000 to 2,200,000, or 1,500,000 to 2,000,000. In addition, polydispersity (PDI) may be from 2.0 to 3.9.

According to one embodiment of the present specification, the adhesive composition comprises a crosslinking agent.

According to another embodiment of the present specification, an adhesive composition having proper properties to be used in a foldable display by comprising a crosslinking agent having a functional group capable of reacting with a crosslinkable functional group included in the polymer may be provided.

Specifically, the crosslinking agent may comprise any one or more functional groups selected from the group consisting of an alkoxysilane group, a carboxyl group, an acid anhydride group, a vinyl ether group, an amine group, a carbonyl group, an isocyanate group, an epoxy group, an aziridinyl group, a carbodiimide group and an oxazoline group. Types of the functional group may vary depending on the types of the crosslinkable functional group included in the polymer, or implementation mechanism of the crosslinking structure.

Examples of the crosslinking agent comprising a carboxyl group may comprise aromatic dicarboxylic acids such as o-phthalic acid, isophthalic acid, terephthalic acid, 1,4-dimethylterephthalic acid, 1,3-dimethylisophthalic acid, 5-sulfo-1,3-dimethylisophthalic acid, 4,4-biphenyldicarboxylic acid, 1,4-naphthalenedicarboxylic acid, 2,6-naphthalenedicarboxylic acid, norbornene dicarboxylic acid, diphenylmethane-4,4'-dicarboxylic acid or phenylindane dicarboxylic acid; aromatic dicarboxylic anhydrides such as phthalic anhydride, 1,8-naphthalenedicarboxylic anhydride or 2,3-naphthalenedicarboxylic anhydride; alicyclic dicarboxylic acids such as hexahydrophthalic acid; alicyclic dicarboxylic anhydrides such as hexahydrophthalic anhydride, 3-methyl-hexahydrophthalic anhydride, 4-methyl-hexahydrophthalic anhydride or 1,2-cyclohexanedicarboxylic anhydride; or aliphatic dicarboxylic acids such as oxalic acid, malonic acid, succinic acid, adipic acid, sebacic acid, azelaic acid, suberic acid, maleic acid, chloromaleic acid, fumaric acid, dodecanedioic acid, pimelic acid, citraconic acid, glutaric acid or itaconic acid.

Examples of the crosslinking agent comprising an anhydride group may comprise pyromellitic anhydride, benzophenonetetracarboxylic dianhydride, biphenyltetracarboxylic dianhydride, oxydiphthalic dianhydride, diphenylsulfonetetracarboxylic dianhydride, diphenylsulfidetetracarboxylic dianhydride, butanetetracarboxylic dianhydride, perylenetetracarboxylic dianhydride, naphthalenetetracarboxylic dianhydride or the like.

Examples of the crosslinking agent comprising a vinyl ether group may comprise ethylene glycol divinyl ether, diethylene glycol divinyl ether, triethylene glycol divinyl ether, tetraethylene glycol divinyl ether, pentaerythritol divinyl ether, propylene glycol divinyl ether, dipropylene glycol divinyl ether, tripropylene glycol divinyl ether, neopentyl glycol divinyl ether, 1,4-butanediol divinyl ether, 1,6-hexanediol divinyl ether, glycerin divinyl ether, trimethylolpropane divinyl ether, 1,4-dihydroxycyclohexane divinyl ether, 1,4-dihydroxymethylcyclohexane divinyl ether, hydroquinone divinyl ether, ethylene oxide-modified hydroquinone divinyl ether, ethylene oxide-modified resorcin divinyl ether, ethylene oxide-modified bisphenol A divinyl ether, ethylene oxide-modified bisphenol S divinyl ether, glycerin trivinyl ether, sorbitol tetravinyl ether, trimethylolpropane trivinyl ether, pentaerythritol trivinyl ether, pentaerythritol tetravinyl ether, dipentaerythritol hexavinyl ether, dipentaerythritol polyvinyl ether, ditrimethylolpropane tetravinyl ether, ditrimethylolpropane polyvinyl ether or the like.

Examples of the crosslinking agent comprising an amine group may comprise aliphatic diamines such as ethylenediamine or hexamethylenediamine; alicyclic diamines such as 4,4'-diamino-3,3'-dimethyldicyclohexylmethane, 4,4'-diamino-3,3'-dimethyldicyclohexyl, diaminocyclohexane or isophoronediamine; aromatic diamines such as xylenediamine, or the like.

Examples of the crosslinking agent comprising an isocyanate group may comprise an aromatic polyisocyanate such as 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4''-triphenylmethane triisocyanate, ω,ω'-diisocyanate-1,3-dimethylbenzene, ω,ω'-diisocyanate-1,4-dimethylbenzene, ω,ω'-diisocyanate-1,4-diethylbenzene, 1,4-tetramethylxylylene diisocyanate, 1,3-tetramethylxylene diisocyanate, xylylene diisocyanate; an aliphatic polyisocyanate such as trimethylene diisocyanate, tetramethylene diisocyanate, hexamethylene diisocyanate, pentamethylene diisocyanate 1,2-propylene diisocyanate, 2,3-butylene diisocyanate, 1,3-butalene diisocyanate, dodecamethylene diisocyanate or 2,4,4-trimethylhexamethylene diisocyanate; an alicyclic polyisocyanate such as 3-isocyanate methyl-3,5,5-trimethylcyclohexylisocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexylisocyanate) or 1,4-bis(isocyanatemethyl)cyclohexane, or the like, or a reactant of one or more of the above-described polyisocyanates and a polyol.

Examples of the crosslinking agent comprising an epoxy group may comprise ethylene glycol diglycidyl ether, triglycidyl ether, trimethylolpropane triglycidyl ether, N,N,N',N'-tetraglycidyl-1,3-xylenediamine, glycerin diglycidyl ether or the like.

According to one embodiment of the present specification, an adhesive composition may perform a crosslinking reaction with the crosslinkable functional group included in the polymer by comprising the crosslinking agent.

According to one embodiment of the present specification, the adhesive composition may further comprise, in addition to the polymer and the crosslinking agent described above, known additional components such as an antistatic agent, an adhesion-providing resin, a curing agent, an ultraviolet stabilizer, an antioxidant, a colorant, a reinforcing agent, a filler, a defoamer, a surfactant or a plasticizer.

According to one embodiment of the present specification, the adhesive composition has bending reliability suitable for a foldable display, and for example, may be used in applications such as attaching a panel, a cover glass and the like in a foldable display.

Another embodiment of the present specification may provide an adhesive layer comprising the adhesive composition for a foldable display described above, or a cured material thereof.

In the adhesive layer provided in one embodiment of the present specification, a release film is further included on one surface or both surfaces of the adhesive layer.

The release film is a layer for protecting a very thin adhesive layer, and refers to a transparent layer attached on one surface of both surfaces of the adhesive layer, and films having excellent mechanical strength, thermal stability, moisture barrier properties, isotropy and the like may be used. For example, acetate-based such as triacetyl cellulose (TAC), polyester-based, polyethersulfone-based, polycarbonate-based, polyamide-based, polyimide-based, polyolefin-based, cycloolefin-based, polyurethane-based and acryl-based resin films, and the like, may be used, however, the release film is not limited thereto as long as it is a commercially-available silicone-treated release film.

Another embodiment of the present specification may provide a foldable display comprising the adhesive layer described above.

Other specific constitutions of the foldable display are, for example, known in Korean Patent Application Laid-Open Publication No. 2015-0138450 and the like, and the present application may comprise such known foldable display constitutions without limit.

In one embodiment of the present specification, a foldable display comprising a back plate substrate; the adhesive layer according to the present application provided on one surface of the back plate substrate; and a display panel provided on a surface opposite to the surface in contact with the back plate substrate of the adhesive layer is provided.

In the foldable display provided in one embodiment of the present specification, the back plate substrate comprises any one or more selected from the group consisting of polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulfone (PES) and cycloolefin polymers (COP).

In another embodiment, the back plate substrate may be a polyimide (PI) substrate.

The foldable display provided in one embodiment of the present specification further comprises a support on a surface opposite to the surface in contact with the adhesive layer of the back plate substrate.

The support may adhere to the back plate substrate through the adhesive layer, and as the adhesive layer, the adhesive layer according to the present application may be used.

In one embodiment of the present specification, a polarizing plate may be further included on a surface opposite to the surface in contact with the adhesive layer of the display panel, and the polarizing plate and the display panel may adhere through the adhesive layer according to the present application.

In addition, a cover window may be further included on a surface opposite to the surface in contact with the display panel of the polarizing plate, and the polarizing plate and the cover window may adhere through the adhesive layer according to the present application.

In the present specification, the foldable display comprises a display panel; and a folding adjustment means attached on a back surface of the display panel, and the folding adjustment may comprise an elastic plate, a chain plate disposed on a back surface of the elastic plate, and an upper plate and a lower plate respectively disposed on an upper surface or a lower surface of the chain plate.

Hereinafter, the present specification will be described in detail with reference to examples. However, the examples according to the present specification may be modified to various other forms, and the scope of the present specification is not to be construed as being limited to the examples described below. Examples of the present specification are provided in order to more fully describe the present specification to those having average knowledge in the art.

In the present specification, properties of the adhesive composition are evaluated in the following manner.
Measurement of Storage Modulus After coating each of the adhesive compositions prepared in examples and comparative examples between release films, the result was cut to a size of 15 cm×25 cm, and after removing the release film on one surface, the result was laminated several times to have a thickness of approximately 1 mm.

Subsequently, the laminate was cut to a circular shape with a diameter of 8 mm, compressed using glass, and left unattended overnight to enhance wetting at interfaces between each layer, and bubbles generated during the lamination were removed to prepare a sample. Then, the sample was placed on a parallel plate, and after adjusting a gap, normal & torque was set to zero, normal force stabilization was checked, and storage modulus was measured.

(1) Measuring Device and Measuring Condition

Measuring device: ARES-G2 provided with a forced convection oven, TA Instruments Inc.

(2) Measuring Condition:
Geometry: 8 mm parallel plate
Spacing: approximately 1 mm
Test type: dynamic strain frequency sweep
Strain=0.1 [%]
Temperature: −20° C.
Frequency: 1 Hz Example 1

To a 1 L reactor having nitrogen gas refluxed inside and equipped with a cooling device so as to readily control a temperature, 98 parts by weight of ethylhexyl acrylate (EHA) and 2 parts by weight of acrylic acid (AA) were introduced based on 100 parts by weight of the alkyl (meth)acrylate and the monomer having a crosslinkable functional group. Subsequently, 150 parts by weight of ethyl acetate (EAc) was introduced thereto as a solvent based on 100 parts by weight of the alkyl (meth)acrylate and the monomer having a crosslinkable functional group, and after purging the reactor with nitrogen gas for 60 minutes to remove oxygen, 0.02 parts by weight of azobisisobutyronitrile (AIBN), a reaction initiator, was introduced thereto while maintaining the temperature at 60° C. to initiate a reaction. The reaction material reacted for approximately 1 hour was diluted with ethyl acetate (EAc) to prepare an acrylic polymer having a molecular weight of approximately 2,000,000. With respect to 100 parts by weight of the acrylic polymer, 0.03 parts by weight of N,N,N',N'-tetraglycidyl-m-xylenediamine (BXX-5240, manufactured by Sam Young Ink & Paint MFG. Co., Ltd.), a crosslinking agent, was mixed to prepare an adhesive composition.

On a silicone release film (RF12N) of SKC, the adhesive composition (C1) was coated to a thickness of approximately 25 μm and dried, and after coating a light peel release film (RF02N) thereon, the result was cured for 2 days at 40° C. to form an adhesive layer.

Example 2

An adhesive layer was formed in the same manner as in Example 1 except that the acrylic polymer was prepared by introducing 59 parts by weight of ethylhexyl acrylate (EHA), 40 parts by weight of butyl acrylate (BA) and 1 parts by weight of beta-carboxylethyl acrylate (B-CEA) instead of 98 parts by weight of ethylhexyl acrylate (EHA) and 2 parts by weight of acrylic acid (AA).

Example 3

An adhesive layer was formed in the same manner as in Example 1 except that the acrylic polymer was prepared by introducing 97.5 parts by weight of butyl acrylate (BA) and 2.5 parts by weight of acrylic acid (AA) instead of 98 parts by weight of ethylhexyl acrylate (EHA) and 2 parts by weight of acrylic acid (AA).

Comparative Example 1

An adhesive layer was formed in the same manner as in Example 1 except that the acrylic polymer was prepared by introducing 98 parts by weight of ethylhexyl acrylate (EHA) and 2 parts by weight of acrylic acid (AA), and with respect to 100 parts by weight of the acrylic polymer, the crosslinking agent was introduced in 0.3 parts by weight.

Comparative Example 2

An adhesive layer was formed in the same manner as in Example 1 except that the acrylic polymer was prepared by introducing 19 parts by weight of ethylhexyl acrylate (EHA), 80 parts by weight of butyl acrylate (BA) and 1 parts by weight of beta-carboxylethyl acrylate (B-CEA) instead of 98 parts by weight of ethylhexyl acrylate (EHA) and 2 parts by weight of acrylic acid (AA).

Comparative Example 3

An adhesive layer was formed in the same manner as in Example 1 except that the acrylic polymer was prepared by introducing 98 parts by weight of ethylhexyl acrylate (EHA) and 2 parts by weight of acrylic acid (AA), and with respect to 100 parts by weight of the acrylic polymer, the crosslinking agent was introduced in 0.5 parts by weight.

Comparative Example 4

An adhesive layer was formed in the same manner as in Example 1 except that the acrylic polymer was prepared by introducing 94 parts by weight of ethylhexyl acrylate (EHA) and 6 parts by weight of acrylic acid (AA) instead of 98 parts by weight of ethylhexyl acrylate (EHA) and 2 parts by weight of acrylic acid (AA).

Comparative Example 5

An adhesive layer was formed in the same manner as in Example 1 except that the acrylic polymer was prepared by introducing 98 parts by weight of butyl acrylate (BA) and 2 parts by weight of acrylic acid (AA) instead of 98 parts by weight of ethylhexyl acrylate (EHA) and 2 parts by weight of acrylic acid (AA).

Comparative Example 6

An adhesive layer was formed in the same manner as in Example 1 except that the acrylic polymer was prepared by introducing 99 parts by weight of butyl acrylate (BA) and 1 parts by weight of acrylic acid (AA) instead of 98 parts by weight of ethylhexyl acrylate (EHA) and 2 parts by weight of acrylic acid (AA), and the crosslinking agent was introduced in 0.5 parts by weight.

After curing each of the compositions according to the examples and the comparative examples, initial stress, final stress after strain for 10 minutes, and a stress drop of the adhesive layer were measured from the adhesive layer sample having a size of approximately width: 6 mm, thickness: 1 mm and length: 10 mm to 15 mm under a condition of −20° C., 12% strain 600 seconds and recovery 1200 seconds using a dynamic mechanical analyzer (DMA) (TA Instruments Inc.), and storage modulus at −20° C. was measured using ARES-G2, a TA instruments device, equipped with a forced convection oven.

In other words, when the adhesive layer sample is stretched in a longer side direction with 12% strain and maintained for a certain period of time (600 s), stress starts to decrease and is maintained without major changes after a certain period of time (600 s), and final stress was measured as the stress value maintained as above.

In addition, the initial stress, the final stress, the storage modulus, the stress drop, the adhesive strength, and the number of times of panel breakage or delamination during the dynamic folding test at −20° C. are described in the following Table 1.

TABLE 1

|  | Initial Stress Pa | Final Stress Pa | Stress Drop % | Storage Modulus Pa | Adhesive Strength (gf/in) Pl | −20° C., Dynamic Folding Test (Times) |
|---|---|---|---|---|---|---|
| Example 1 | 12941 | 6682 | 48.4 | 222394 | 1464 | 60000 |
| Example 2 | 16154 | 7153 | 55.7 | 122965 | 1114 | 50000 |
| Example 3 | 14865 | 7433 | 50 | 238102 | 1163 | 30000 |
| Comparative Example 1 | 17810 | 13066 | 26.6 | 207767 | 618 | 20000 |
| Comparative Example 2 | 28097 | 15080 | 46.3 | 179863 | 950 | 20000 |
| Comparative Example 3 | 21987 | 18432 | 16.2 | 220614 | 703 | 15000 |
| Comparative Example 4 | 35100 | 14313 | 59.2 | 983903 | 1630 | 15000 |
| Comparative Example 5 | 40874 | 29221 | 28.5 | 345672 | 1280 | 5000 |
| Comparative Example 6 | 39462 | 30756 | 22.1 | 298076 | 691 | 6400 |

According to Comparative Examples 1, 3, 5 and 6 of Table 1, it was seen that, stress generated when folding was not properly released when the stress drop was too low, and stress accumulated in each layer of the panel causing problems more quickly. On the contrary, cohesive strength was insufficient when the stress drop was too high, and using as an adhesive was difficult.

According to Comparative Examples 2, 3, 4 and 5 of Table 1, it was seen that, when initial stress was high, stress was transferred to each layer for each repeated folding and unfolding causing problems on the panel due to accumulated fatigue.

As in Comparative Example 1 of Table 1, it was seen that, when final stress released and remaining after folding was high, stress accumulated on the panel causing problems in the static folding test as well as the dynamic folding test even with low initial stress.

According to Comparative Examples 4 to 6 of Table 1, it was seen that, when storage modulus was too high, stress generated when folding increased at −20° C., which was disadvantageous in folding.

In other words, as seen in Examples 1 to 3 of Table 1, it was identified that the adhesive composition for a foldable display according to one embodiment of the present specification has advantages of satisfying reliability conditions without causing problems such as delamination and breakage even at −20° C. when conducting a folding test while maintaining properties of existing adhesive compositions for a foldable display such as reliability conditions and adhesion properties at room temperature and high temperature.

The invention claimed is:

1. An adhesive composition for a foldable display comprising:
    a polymer comprising an alkyl (meth)acrylate and a monomer having a crosslinkable functional group; and
    a crosslinking agent,
    wherein a content of the alkyl (meth)acrylate is from 97.5 parts by weight to 99 parts by weight and a content of the monomer having a crosslinkable functional group is from 1 parts by weight to 2.5 parts by weight based on 100 parts by weight of the polymer
    wherein the crosslinking agent has one or more functional groups selected from the group consisting of an alkoxysilane group, a carboxyl group, an acid anhydride group, a vinyl ether group, an amine group, a carbonyl group, a carbodiimide group and an oxazoline group, or wherein the crosslinking agent comprises N,N,N',N'-tetraglycidyl-m-xylenediamine,
    wherein the monomer having a crosslinkable functional group is at least one selected from the group consisting of beta-carboxyethyl acrylate, (meth)acrylic acid, 2-(meth)acryloyloxy acetic acid, 3-(meth)acryloyloxy propionic acid, 4-(meth)acryloyloxy butyric acid, an acrylic acid dimer, itaconic acid, maleic acid, and maleic anhydride,
    wherein the monomer having a crosslinkable functional group does not have a hydroxyl group as the only crosslinkable functional group,
    wherein an adhesive strength of the adhesive composition with a polyimide (PI) film after curing is greater than or equal to 500 gf/in and less than or equal to 5,000 gf/in at room temperature;
    a storage modulus of the adhesive composition after curing measured under a condition of −20° C. and 1% strain is greater than or equal to 50,000 Pa and less than or equal to 250,000 Pa;
    an initial stress upon starting strain under a condition of −20° C. and 12% strain is greater than or equal to 5,000 Pa and less than or equal to 20,000 Pa;
    a final stress measured after strain for 10 minutes under a condition of −20° C. and 12% strain is greater than or equal to 1,000 Pa and less than or equal to 10,000 Pa; and
    a stress drop defined by (initial stress-final stress)/(initial stress) is greater than or equal to 40% and less than or equal to 90%.

2. The adhesive composition for a foldable display of claim 1, which has a glass transition temperature (Tg) of higher than or equal to −50° ° C. and lower than or equal to −20° C.

3. The adhesive composition for a foldable display of claim 1, wherein the alkyl (meth)acrylate comprises at least one material selected from methyl (meth)acrylate, ethyl (meth)acrylate, n-propyl (meth)acrylate, isopropyl (meth)acrylate, n-butyl (meth)acrylate, t-butyl (meth)acrylate, isobutyl (meth)acrylate, 2-ethylhexyl (meth)acrylate, 2-ethylbutyl (meth)acrylate, pentyl (meth)acrylate, hexyl (meth)acrylate, cyclohexyl (meth)acrylate, n-octyl (meth)acrylate, isooctyl (meth)acrylate, isononyl (meth)acrylate, decyl (meth)acrylate, dodecyl (meth)acrylate, tridecyl (meth)acrylate, tetradecyl (meth)acrylate, octadecyl (meth)acrylate or isobornyl (meth)acrylate.

4. The adhesive composition for a foldable display of claim 1, wherein a content of the crosslinking agent is in a range of 0.001 parts by weight to 5 parts by weight based on 100 parts by weight of the polymer.

5. The adhesive composition for a foldable display of claim 1, further comprising at least one material selected from an antistatic agent, an adhesion-providing resin, a curing agent, an ultraviolet stabilizer, an antioxidant, a colorant, a reinforcing agent, a filler, a defoamer, a surfactant or a plasticizer.

6. The adhesive composition for a foldable display of claim 1, wherein a content of the alkyl (meth)acrylate is from 98 parts by weight to 99 parts by weight and a content of the monomer having a crosslinkable functional group is from 1 parts by weight to 2 parts by weight based on 100 parts by weight of the polymer.

7. An adhesive layer comprising the adhesive composition for a foldable display of claim 1, or a cured material thereof.

8. The adhesive layer of claim 7, further comprising a release film on one surface or both surfaces of the adhesive layer.

9. A foldable display comprising:

a back plate substrate;

the adhesive layer of claim 7 provided on one surface of the back plate substrate; and a display panel provided on a surface opposite to the surface in contact with the back plate substrate of the adhesive layer.

10. The foldable display of claim 9, further comprising a support on a surface opposite to the surface in contact with the adhesive layer of the back plate substrate.

11. The foldable display of claim 9, wherein the back plate substrate comprises at least one material selected from polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulfone (PES) or cycloolefin polymers (COP).

* * * * *